United States Patent [19]
Clark et al.

[11] Patent Number: 6,104,304
[45] Date of Patent: Aug. 15, 2000

[54] SELF-TEST AND STATUS REPORTING SYSTEM FOR MICROCONTROLLER-CONTROLLED DEVICES

[75] Inventors: Ricke W. Clark, Irvine; Sean O'Leary, Aliso Viejo; David M. Shaheen, Corona; Earl C. Cox, La Crescenta, all of Calif.

[73] Assignee: Conexant Systems, Inc., Newport Beach, Calif.

[21] Appl. No.: 09/347,889

[22] Filed: Jul. 6, 1999

[51] Int. Cl.$^7$ .................................................. G08B 21/00
[52] U.S. Cl. ..................... 340/664; 324/73.1; 324/76.11; 324/522; 361/31; 455/67.4; 455/67.7
[58] Field of Search ..................... 340/664, 660, 340/661, 657, 654, 653, 635, 636; 324/522, 76.11, 73.1; 361/24, 31, 93; 364/140.1, 140.05, 140.09, 483; 455/67.4, 67.1, 423, 67.7

[56] References Cited

U.S. PATENT DOCUMENTS

| | | | |
|---|---|---|---|
| 4,168,527 | 9/1979 | Winkler | 364/580 |
| 5,345,392 | 9/1994 | Mito et al. | 364/483 |
| 5,434,508 | 7/1995 | Ishida | 324/427 |
| 5,586,156 | 12/1996 | Gaubatz | 376/216 |
| 5,781,024 | 7/1998 | Blomberg et al. | 324/763 |
| 5,809,449 | 9/1998 | Harper | 702/63 |
| 5,905,439 | 5/1999 | McIntyre | 340/664 |

*Primary Examiner*—Daniel J. Wu
*Assistant Examiner*—Toan Pham
*Attorney, Agent, or Firm*—Knobbe, Martens, Olson & Bear, LLP

[57] ABSTRACT

An internal self-test and status reporting system for an electrical device with a plurality of components, a power supply and a microcontroller or microprocessor. The self-test system powers on and off each component one at a time and measures an amount of current drawn by the component with an internal current sensor. The self-test system compares the measured amount of current drawn by the component with an expected, predetermined current value or range. The self-test system then reports whether the measured amount of current drawn by the component matches the expected, predetermined current value or is within the expected, predetermined current range. The self-test system reports the results of the self-test by generating a pattern of signals on a general purpose input/output (GPIO) line, displaying a message on a display of the device, or generating a sound with a speaker of the device.

27 Claims, 5 Drawing Sheets

SELF-TEST AND STATUS REPORTING SYSTEM FOR MICROCONTROLLER-CONTROLLED DEVICES

BACKGROUND OF THE INVENTION

1. Field of the Invention

The present invention relates generally to electrical devices or systems. Specifically, the present invention relates to a self-test system for an electrical device or system with at least one microcontroller or microprocessor.

2. Brief Description of the Related Art

In factory testing of an electrical device or system with a microcontroller or a microprocessor, it is important to discover any flaws in the device's components.

Conventionally, a 'bed of nails' test is used to test a microcontroller-controlled device and its components. The bed of nails test typically involves placing a number of test pads on all electrical nodes of a device's circuit board, providing an electrical stimulus and observing the response. The bed of nails test examines the interconnections between different portions of the device's circuitry and the function of individual integrated circuits (ICs).

Designing a bed of nails test method for a particular type of device and acquiring the proper equipment (e.g. test fixtures) required for a bed of nails test are relatively expensive. Another disadvantage is the amount of time required to run the bed of nails test for each device on an assembly line. For example, a typical bed of nails test for a portable communication handset may take four to six minutes per handset. Two important goals in manufacturing are to minimize costs and minimize the time for testing each device. The longer the testing process, the more inefficient and expensive it is.

Furthermore, for devices with high-density circuits, there may be insufficient space on the device's circuit board to put the test pads on all the nodes or at least a sufficient number of nodes to detect and locate all faults. For integrated circuits, testing nodes are even more difficult. In some cases, the design of the device is modified, such as supplying test points or extra interconnectors, to enable a bed of nails test. These modifications to the device further increase the cost of and the amount of time associated with a bed of nails test.

Boundary scan testing is another method used by some manufacturers. But boundary scan testing requires a certain number of pins on the integrated circuits to be dedicated to this testing task. Moreover, boundary scan testing is not very effective on circuits with many discrete components.

SUMMARY OF THE INVENTION

Most electrical devices, particularly devices with high-density circuit boards, have at least one programmable microcontroller (or microprocessor) to control the rest of the device or circuitry.

The present invention relates to an internal, built-in self-test and status reporting system ("self-test system") for an electrical device with at least one microcontroller and/or microprocessor. The self-test system avoids some of the drawbacks of a bed of nails test, such as requiring external equipment to probe internal points and extra interconnectors or test points on a high-density circuit board.

In a preferred embodiment, there is a factory test mode and a field operation test mode. In addition to a manufacturer's assembly line (factory test mode), the self-test system of the present invention may test the microcontrolled device each time the device is powered on in the field (field operation test mode). In one embodiment, the field operation test mode comprises certain executable portions of the factory test mode program.

The self-test system takes advantage of the fact that power is at a premium on many high-density circuit boards within electrical devices. In one embodiment, the self-test system tests discrete components or functional component groups of an electrical device by powering on and off each component or component group. The components are under the direct or indirect control of a microcontroller within the device. The self-test system uses an internal current sensor to measure the difference in power or current consumption (drain) of each component or component group between power on and power off states. The self-test system compares the current measurements with a set of expected, predetermined current ranges or values, preferably stored in the device.

By comparing the current measurements with the expected current ranges, the self-test system may quickly determine whether all components are present and functioning properly. The microcontroller can execute the internal self-test sequence at internal machine speeds, which is significantly faster than running tests with external test equipment, as in a conventional bed of nails test. In one embodiment, the microcontroller completes the entire self-test method for all the components involved in the self-test in a few seconds.

In one embodiment, the current sensor is adapted to measure the amount of current drawn at each component site as each component is powered on and off by the microcontroller. In another embodiment, the current sensor is adapted to measure the amount of current drawn at the power supply as each component is powered on and off by the microcontroller.

In one embodiment, the self-test system first establishes that the microcontroller functions properly, then verifies that the components closest logically to the microcontroller function properly, and then moves progressively to other components to verify that they also function properly.

In one embodiment, the self-test system uses a general purpose input/output (GPIO) line or a set of GPIO pins to send a signal from the microcontroller inside the electrical device to external test equipment. The microcontroller is programmed to toggle the GPIO line or pins in a predetermined pattern when the test is initiated and as each component or component group is tested. If a test is successful, the pattern generated by the microcontroller will match an expected, predetermined pattern. By using a GPIO line for reporting test results, the self-test system minimizes the number of connections to the device during testing and avoids the cost of adding extra connections.

In one embodiment, the self-test system also verifies that an internal clock within the electrical device is working properly. External test equipment may observe the toggling of the GPIO pins in sequence and then determine the frequency of the sequence. In one embodiment, the self-test system also verifies that power supply circuitry is working properly by measuring the amplitude of the GPIO signal.

In one embodiment, external test equipment performs calibration and measurement of external parameters (parametric values), such as logic levels or current consumption. In one embodiment, the self-test system further performs a cyclic redundancy check (CRC) on a program or code, which is executed by the microcontroller to implement the self-test sequence. The whole test sequence, including the testing by the external test equipment, may take approximately 30 seconds or less, compared to the four to six minutes of existing bed of nails tests. In the test sequence of the present invention, no further testing is required. For example, for a portable communication handset, the self-test system eliminates the need to make a communication link, such as an actual phone call, to determine if the handset is working properly.

One aspect of the present invention relates to an internal test system in an electrical device with at least one power supply and a plurality of components. The internal test system comprises a microcontroller adapted to control the power on and off of each component of the plurality of components one at a time; a current sensor adapted to measure the amount of current drawn by each component of the plurality of components as the component is powered on and off by the microcontroller, the microcontroller comparing the amount of current drawn by each component as measured by the current sensor with an expected current range for each component; and an output adapted to report whether the amount of current drawn by each component as measured by the current sensor is within the expected current range for each component.

In one embodiment, the current sensor is within the electrical device. In one embodiment, the current sensor is adapted to measure the amount of current drawn at each component site as each component is powered on and off by the microcontroller. In another embodiment, the current sensor is adapted to measure the amount of current drawn at the power supply as each component is powered on and off by the microcontroller. In one embodiment, the microcontroller powers on at least one component for a set period of time before powering the component off. In one embodiment, the electrical device further comprises a memory adapted to store an order in which the plurality of components are tested, and a set of expected current ranges for the plurality of components. In one embodiment, the output is a pattern of signals on a serial input/output (I/O) port (not shown) and/or a general purpose input/output (GPIO) line. In another embodiment, the output is a message on a display of the electrical device. In another embodiment, the output is a sound generated by a speaker.

In one embodiment, the electrical device is a portable communication handset. In one embodiment, the portable communication handset is a wireless phone. In another embodiment, the portable communication handset is a cordless phone. In another embodiment, the portable communication handset is a cellular phone. In one embodiment, the power supply is a lithium ion cell. In one embodiment, the plurality of components are selected from a group consisting of a power amplifier; a low noise amplifier (LNA) mixer; an analog-to-digital converter; a digital-to-analog converter; an intermediate frequency (IF) amplifier; a speaker driver; a bias supply for a microphone; a set of discrete controls; a plurality of loop backs; and any combination of the above components. In one embodiment, the output provides sufficient information to an external test equipment to perform a fault isolation procedure. In one embodiment, the output provides sufficient information to an external test equipment to determine whether a clock inside the electrical device is functioning properly.

Another aspect of the present invention relates to an internal test system in an electrical device with at least one power supply and a plurality of component groups. The internal test system comprises a microcontroller adapted to control the power on and off of each component group of the plurality of component groups one at a time; a current sensor adapted to measure the amount of current drawn by each component group of the plurality of component groups as the component group is powered on and off by the microcontroller, the microcontroller comparing the amount of current drawn by each component group as measured by the current sensor with an expected current range for each component group; and an output adapted to report whether the amount of current drawn by each component group as measured by the current sensor is within the expected current range for each component group.

Another aspect of the present invention relates to a method of testing a plurality of components in an electrical device with at least one power supply and one microcontroller. The method comprises powering on and off each component of the plurality of components one at a time; measuring the amount of current drawn by each component as the component is powered on and off; comparing the amount of current drawn by each component with an expected current range for each component; and reporting whether the amount of current drawn by each component is within the expected current range for each component. In one embodiment, one or more components closest logically to the microcontroller are tested first, and one or more components farthest logically to the microcontroller are tested last. In another embodiment, more reliable components are tested before less reliable components.

In one embodiment, the method further comprises receiving an external signal to begin powering on and off each component of the plurality of components one at a time. In one embodiment, the method further comprises performing fault isolation to determine which components are defective based on the amount of current drawn by each component compared to the expected current range for each component. In one embodiment, the act of reporting whether the amount of current drawn by each component is within the expected current range for each component comprises generating a pattern of signals on a general purpose input/output (GPIO) line. In another embodiment, the act of reporting whether the amount of current drawn by each component is within the expected current range for each component comprises generating a message on a display of the electrical device. In another embodiment, the act of reporting whether the amount of current drawn by each component is within the expected current range for each component comprises generating a sound from a speaker.

DETAILED DESCRIPTION OF THE PREFERRED EMBODIMENT

The present invention relates to a self-test and status reporting system ("self-test system") for an electrical device with at least one microcontroller and/or microprocessor. While embodiments and applications of the present invention are described below, it will be apparent to those skilled in the art that various modifications are possible without departing from the scope of the present invention. For example, the self-test system is described below with reference to a portable communication device of FIG. 1. Those skilled in the art will appreciate that the self-test system may be implemented in other electrical devices with a microcontroller or microprocessor. The present invention is ideally suited for devices with one or more relatively small, high-density microcontroller-controlled circuit(s).

Figure 1:
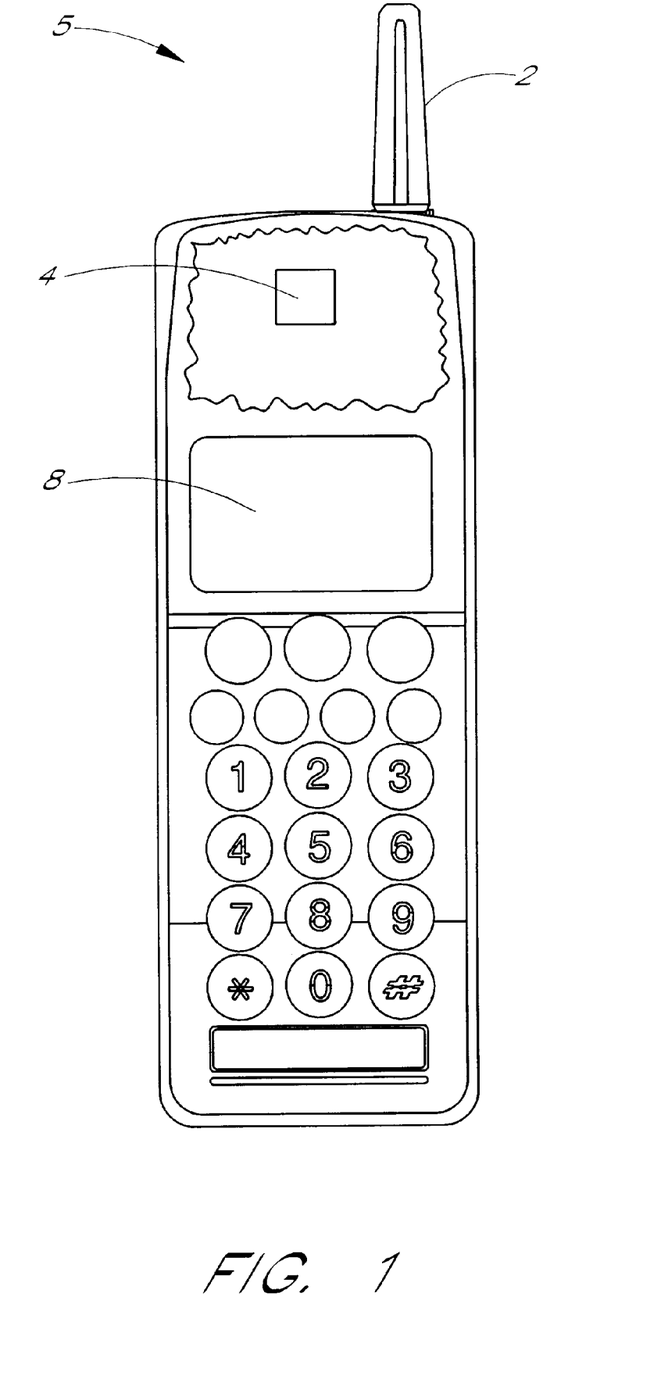
FIG. 1 illustrates a portable communication device.

FIG. 1 illustrates a portable communication device or handset 5. The handset 5 may be a wireless phone, a cellular phone, a cordless phone, etc. The handset 5 comprises an antenna 2, a microcontroller 4 with an internal self-test system and a display 8. In one configuration, the display 8 is a liquid crystal display (LCD). The handset 5 may comprise other components, such as a keypad, one or more input ports (not shown), one or more output ports and a battery compartment with a removable or rechargeable battery.

Figure 2:
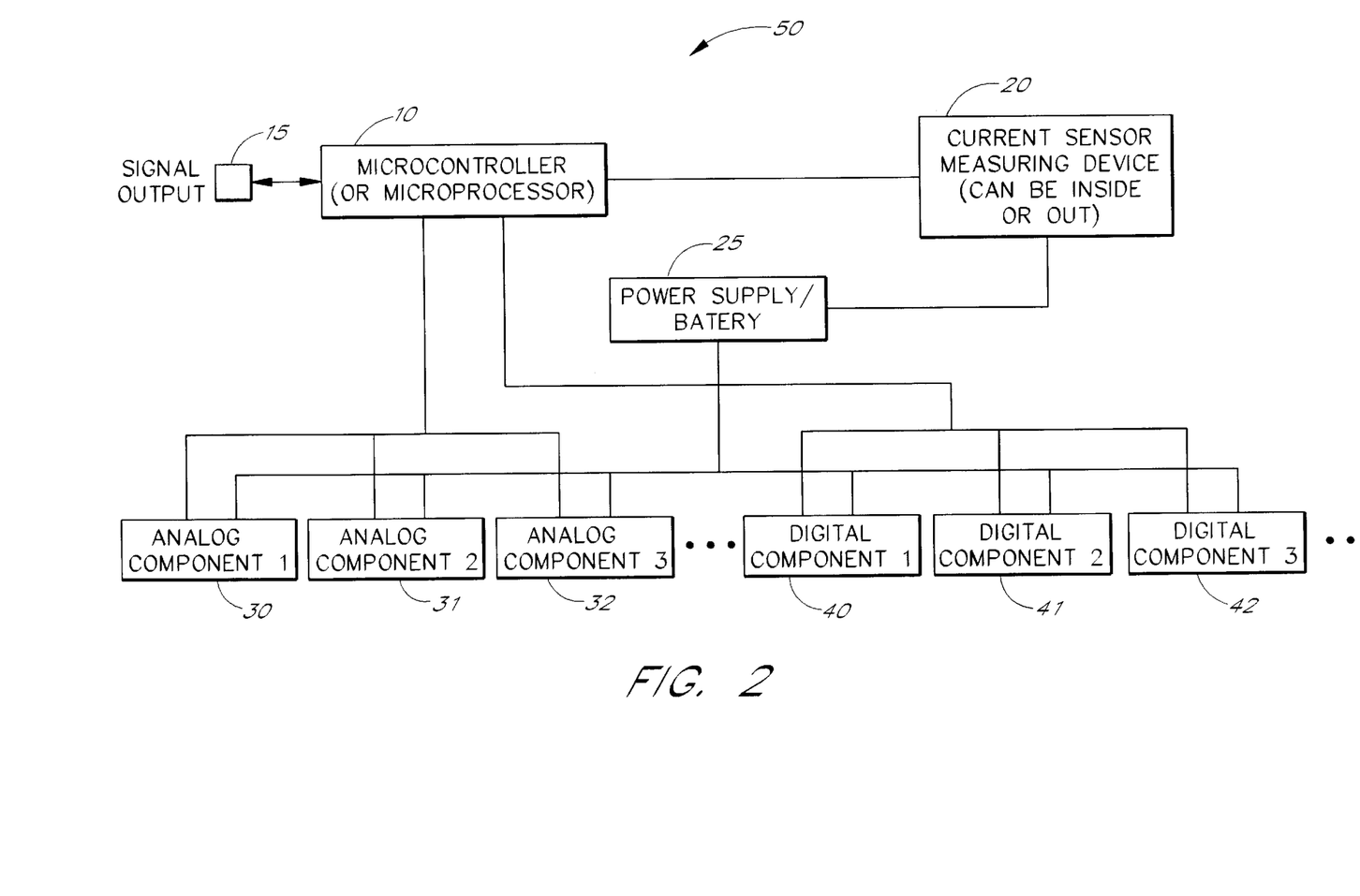
FIG. 2 illustrates one configuration of an electrical device with a microcontroller, a current sensor and a plurality of components.

FIG. 2 illustrates one configuration of an electrical device 50 in accordance with the present invention. In FIG. 2, the electrical device 50 comprises a microcontroller 10, a signal output 15, a current sensor/measuring device 20, a power supply or battery 25, a plurality of analog components (or component groups) 30–32 and a plurality of digital components (or component groups) 40–42.

In a preferred embodiment, the current sensor 20 is inside the electrical device 50. In one configuration, the current sensor 20 has its own analog-to-digital (A/D) converter (not shown). In another configuration, the current sensor 20 uses an A/D converter (not shown) within the device 50 which is associated with one of the component groups 30–32, 40–42. For example, the current sensor 20 may use an A/D converter(s) and circuitry which is used by the device 50 to monitor the level of current drawn by the battery 25. This is typical in lithium ion cell devices.

Figure 3:
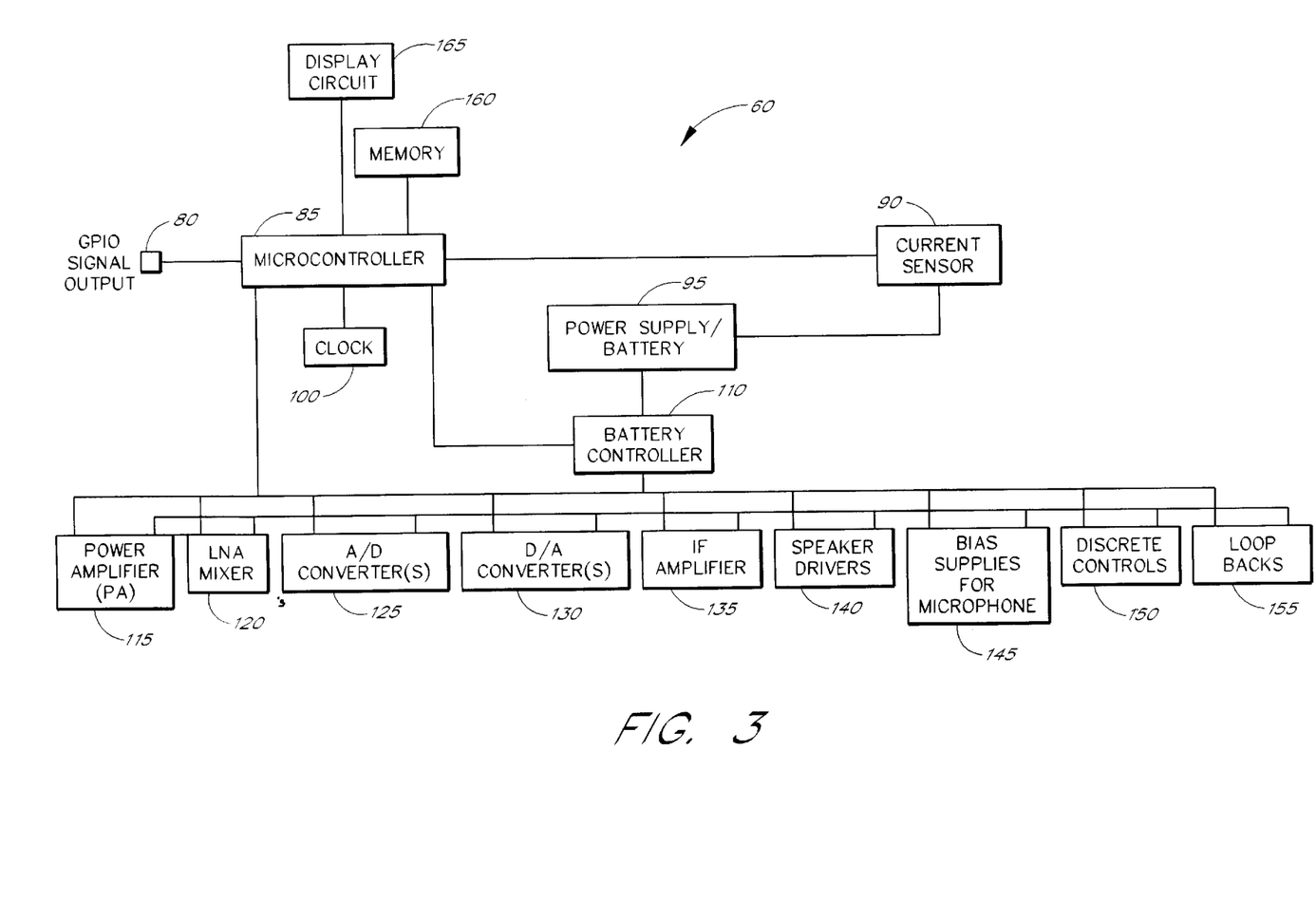
FIG. 3 illustrates one configuration of the portable communication device of FIG. 1 with a microcontroller, a current sensor and a plurality of components.

FIG. 3 illustrates one configuration of an electrical system 60 of the portable communication device 5 of FIG. 1. In FIG. 3, the electrical system 60 comprises a general purpose input/output (GPIO) line or signal output 80, a microcontroller 85, a current sensor 90, a power supply or battery 95, a clock 100, a battery controller 110, a power amplifier (PA) 115, a low-noise amplifier (LNA) mixer 120, one or more A/D converters 125, one or more digital-to-analog (D/A) converters 130, an intermediate frequency (IF) amplifier 135, one or more speaker drivers 140, one or more bias supplies 145 for a microphone, one or more discrete controls 150, one or more loop backs 155, a memory 160 and a display circuit 165. Other components may also be present.

In FIG. 3, the memory 160 may comprise a read only memory (ROM), a programmable random access memory (RAM) and/or other types of memories known in the art. In a preferred embodiment, the current sensor 90 is inside the electrical system 60. Alternatively, in another embodiment, the current sensor 90 is external to the system 60 (FIG. 3) or device 5 (FIG. 1). An external current sensor may be a part of other external test equipment, as described below.

Figure 4:
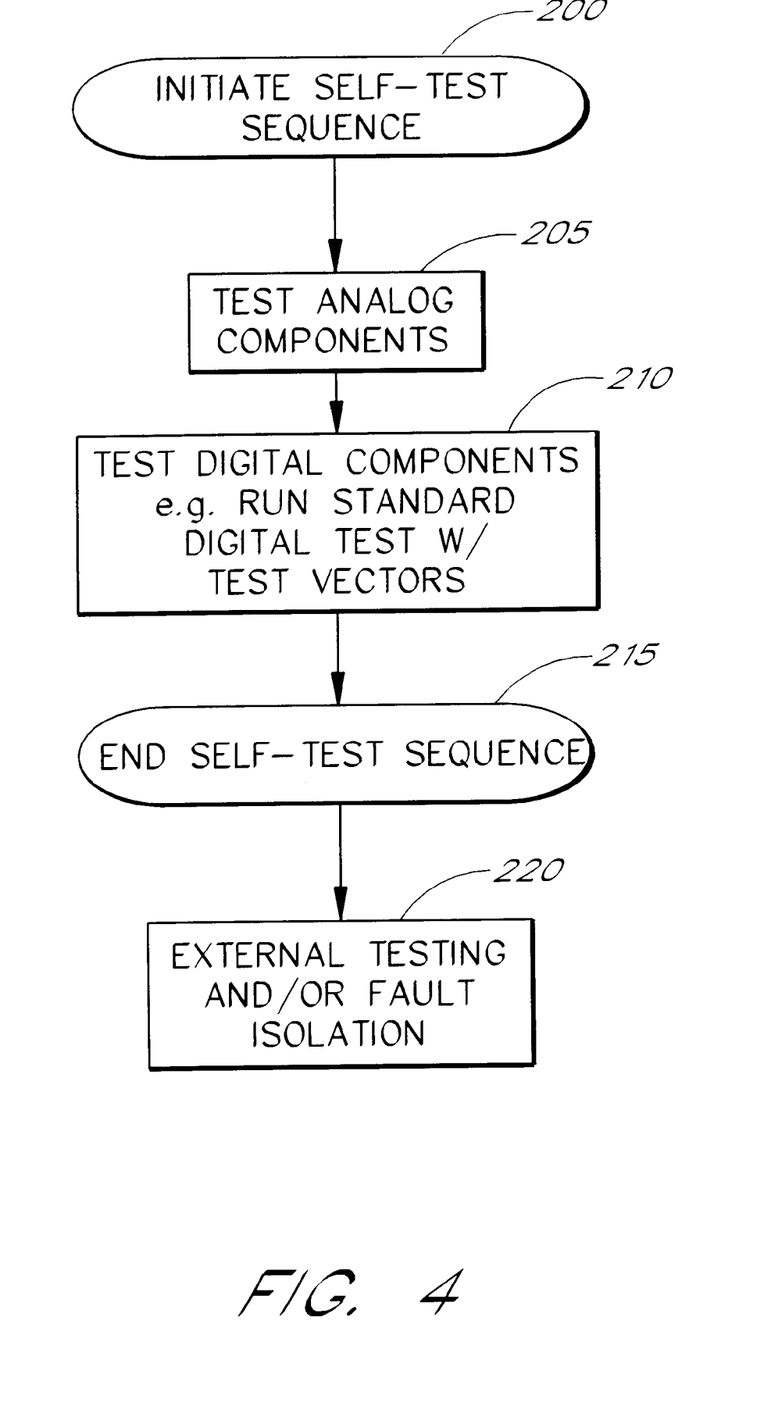
FIG. 4 illustrates a general test sequence in accordance with the present invention which may be implemented by the electrical device of FIG. 2 or the electrical device of FIG. 3.

FIG. 4 illustrates a general test sequence in accordance with the present invention which is implemented by the electrical device 50 of FIG. 2 or the electrical system 60 of FIG. 3. The use and operation of the test sequence of FIG. 4 is described with reference to FIGS. 1, 3 and 5. In a start block 200, the system 60 of FIG. 3 (or device 50 of FIG. 2) initiates an internal self-test sequence. In a process block 205, the system 60 tests the analog components of the system 60. In a process block 210, the system 60 tests the digital components. For example, in one embodiment, the system 60 runs a standard digital test with test vectors by inputting signals into the digital components and observing the output signals.

The internal self-test sequence instructions (applying stimulus and observing the response) are preferably implemented by an internal code or firmware, which is stored in the memory 160 and executed by the microcontroller 85. The memory 160 may also store a set of expected, predetermined current ranges or values for the components 115–155. The memory 160 may also store a set of test vectors for testing the digital components. The microcontroller 85 can execute the internal self-test sequence at internal machine speeds, which is significantly faster than running tests with external test equipment, as in a conventional bed of nails test.

In one embodiment, the internal self-test sequence of FIG. 4 tests the individual components 115–155 one at a time. In another embodiment, the internal self-test sequence tests component groups or sections, one at a time. In the following description, the self-test sequence is described as testing one component 115–155 at a time.

In a process block 215, the system 60 ends the internal self-test sequence. In one embodiment, external test equipment (not shown) conducts external testing and/or fault isolation in a process block 220. The external testing may occur during and/or after the internal self-test sequence. For example, the external test equipment may be measuring and processing an output from the GPIO signal output 80 (FIG. 3) of the system 60 during the internal self-test sequence. The external test equipment may then perform fault isolation after the internal self-test is complete.

Figure 5:
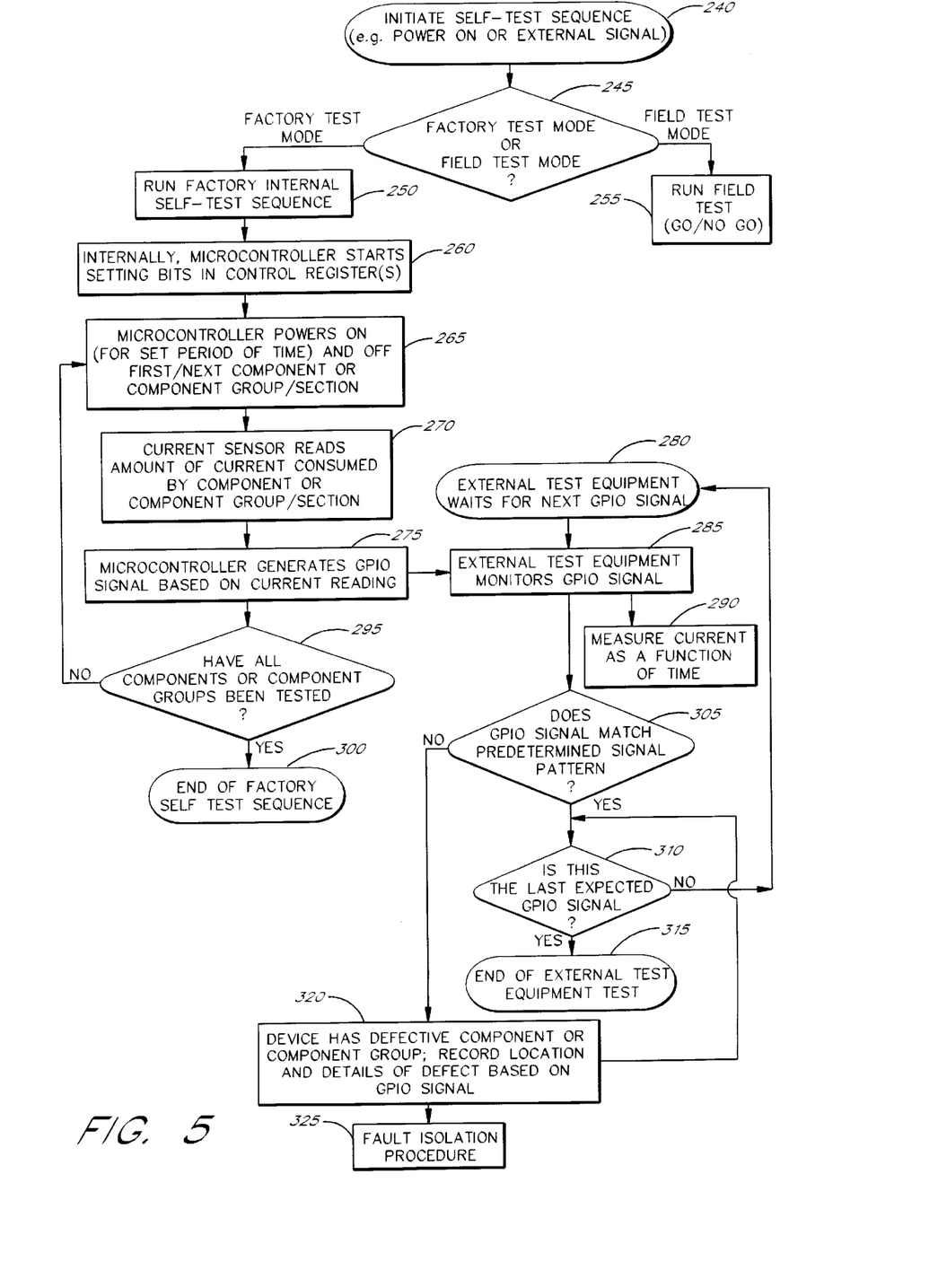
FIG. 5 illustrates one embodiment of the test sequence of FIG. 4 in further detail.

FIG. 5 illustrates one embodiment of the test sequence of FIG. 4 in further detail. In a start block 240, the system 60 initiates an internal self-test sequence when the system 60 is powered on or when the system 60 receives an external signal. In a decision block 245, the microcontroller 85 of the system 60 (FIG. 3) determines whether the system 60 is presently in a factory test mode or a field operation test mode. When the system 60 is powered on in the field (after manufacturing), the system 60 is in the field operation test mode. The microcontroller 85 runs a field test, as shown in a process block 255 and described below.

When the system 60 is powered on for the first time (during manufacturing) or when the system 60 receives a particular external signal designated by the manufacturer, the system 60 is in the factory test mode. In a process block 250, the microcontroller 85 runs a factory internal self-test sequence. In a process block 260, the microcontroller 85 starts setting bits in a set of control registers (not shown).

In a process block 265, the microcontroller 85 causes the battery 95 to power on and off the components (or component groups) 115–155 of the system 60 one at a time. In a process block 270, the current sensor 90 observes the amount of power or current drain within a component 115–155 as that component 115–155 is powered on and off. In one embodiment, the microcontroller 85 causes the battery 95 to power on certain components 115–155 for a set period of time. The period of time is set sufficiently long in duration to allow the microcontroller 85 and the current sensor 90 to determine whether a particular component 115–155 is drawing the proper amount of current.

In one configuration, the current sensor 90 measures the amount of current drawn at each individual component 115–155 (or component group). In another embodiment, the current sensor 90 measures the amount of current drawn directly at the battery 95 as each component 115–155 is powered on and off. By measuring the amount of current at the battery 95, this embodiment further reduces the number of test points in the system 60.

When a component 115–155 draws current which matches an expected level or range (predetermined for that component 115–155) when it is powered on, and if the current decreases to an expected level or range when the component 115–155 is powered off, then the microcontroller 85 acknowledges that the component 115–155 is functioning properly. For example, in a CMOS logic circuit, the level of activity determines the amount of current drawn. Measuring the amount of current drawn and comparing that amount with a predetermined, acceptable amount or range provides an indication of whether the circuit is performing properly. The internal self-test sequence will also find gross faults, such as short circuits or open circuits, and the location of fundamental defects.

Alternatively, in another embodiment, the system 60 comprises ENABLE lines (not shown) on some or all of the components 115–155. An ENABLE line allows the microcontroller 85 to enable or disable a component 115–155 independent of whether power is supplied by the battery 95. The microcontroller 85 and the current sensor 90 observe the current draw of a component 115–155 during enable and disable periods to determine if the component 115–155 is functioning properly. With enable and disable, however, there may be a small amount of leakage current, in contrast to virtually no leakage current if a component 115–155 is powered off.

In one embodiment, the microcontroller 85 and the current sensor 90 are configured to test the analog components of the system 60 of FIG. 3. In another embodiment, the microcontroller 85 and the current sensor 90 are configured to test both the analog and digital components 115–155 of the system 60. For example, in one configuration, the microcontroller 85 and the current sensor 90 are configured to test the radio frequency (RF) components of a portable communication handset 5 (FIG. 1).

In one embodiment, the internal self-test sequence of FIG. 5 first establishes that the microcontroller 85 is functioning properly. The self-test sequence then verifies that the components 115–155 immediately around (from a logic standpoint) the microcontroller 85 function properly. The self-test sequence then moves progressively (logically) to other components 115–155 to verify that they also function properly.

In a process block 275, the microcontroller 85 generates a report or signal via the GPIO signal output (GPIO line or pins) 80 based on a reading by the current sensor 90. In a preferred embodiment, the GPIO line is used by the system 60 for other purposes, and thus an additional GPIO line or test point is not required. By using a GPIO signal output 80 to report internal self-test results, the system 60 and the self-test sequence minimize the number of connections to the system 60 during testing and avoid the costs of adding extra test connections.

In one embodiment, the microprocessor 85 is programmed to toggle the GPIO pins in a predetermined pattern when the test is initiated and/or successful. In one embodiment, the microcontroller 85 toggles the GPIO line once after the internal self-test sequence of FIG. 5 completes a component test. In another embodiment, the microcontroller 85 toggles the GPIO line once if a completed component test was successful. In another embodiment, the microcontroller 85 toggles the GPIO line once after a component test and once more if the component test was successful. Any observable, deterministic pattern may be used by the self-test sequence and the microcontroller 85 on the GPIO line to indicate whether internal tests have been performed and whether the tests were successful.

In a process block 280, external test equipment (not shown) observes the GPIO signal output 80 from the system 60. In a process block 285, the external test equipment monitors and processes the GPIO signal output 80. In a process block 305, the external test equipment determines whether the GPIO signal output 80 matches an expected, predetermined signal pattern. If the GPIO signal output 80 does not match an expected, predetermined signal pattern, the external test equipment acknowledges that the system 60 has a defective component (or component group), as shown in a process block 320.

In one embodiment, the GPIO signal output 80 is substantially the same for each component. In this embodiment, the order of the GPIO signals determines which components 115–155 are defective and which components 115–155 are not defective. For example, in one configuration, the internal self-test sequence is configured to test the power amplifier 115, the LNA mixer 120 and the A/D converters 125 first, second and third respectively. If the GPIO line outputs two signals, but not a third signal, then the external test equipment acknowledges that the A/D converters 125 are defective.

Alternatively, in another embodiment, each component 115–155 has a particular GPIO signal which is pre-assigned to that component 115–155. This allows the external test equipment to distinguish which components 115–155 are defective (isolate the defect location), if any, without relying on the order of the GPIO signals. Thus, the internal self-test sequence may test components 115–155 at random. For example, a GPIO signal pre-assigned to the IF amplifier 135 has a different waveform than the GPIO signals pre-assigned to the other components 120–155, such as the LNA mixer 120. If the external test equipment does not detect the GPIO signal pre-assigned to the IF amplifier 135 at the end of the internal self-test sequence, then the external test equipment acknowledges that the IF amplifier 135 is defective.

To generate a report via the GPIO signal output 80, the microcontroller 85 assumes a certain amount of circuitry in the system 60 is functioning properly. In one embodiment, the most reliable component 115–155 (or component least likely to have a defect) is tested first, followed by the second most reliable component 115–155. In this manner, the components that are least likely to have a defect are tested first until the components that are most likely to have a defect are tested last. This increases the likelihood of the microcontroller 85 to generate a number of signals via the GPIO signal output 80 (indicating successful tests) to the external test equipment before a defective component is detected.

In the process block 320, the external test equipment may record the location and details of the defect based on the GPIO signal output 80. In a process block 325, the external test equipment may perform fault isolation. In one embodiment, in order to save time, the procedure of fault isolation is not part of the production line process itself.

If the GPIO signal output 80 matches an expected, predetermined signal, the external test equipment then determines whether the GPIO signal was the last expected signal in a pattern of expected GPIO signals, as shown in a process block 310. If the GPIO signal was the last expected signal in a pattern of expected GPIO signals, then the external test equipment has completed its external test, and the system 60 may pass to a next stage of the overall manufacturing process. If the GPIO signal was not the last expected signal in a pattern of expected GPIO signals, then the external test equipment waits for another GPIO signal at the GPIO signal output 80, as shown in the process block 280.

In a process block 295, the microcontroller 275 determines whether all the components 115–155 have been tested (by the battery 95 and the current sensor 90). If all the components 115–155 have been tested, then the internal self-test sequence is complete. If the components 115–155 have not all been tested, then the microcontroller 85 tests the next component 115–155 in the system 60. In a preferred embodiment, the microcontroller 85 completes the internal self-test sequence (blocks 250–275, 295, 300) for all the components 115–155 in a few seconds.

Alternatively, in another embodiment, the microcontroller 85 generates a signal to the display circuit 165 which displays a waveform, symbol or message on the display 8 of the handset 5 (FIG. 1) after each component 115–155 or all the components 115–155 are tested. In this embodiment, the external test equipment comprises a monitor, such as a human equipment operator, a light sensor, or a circuit. In one embodiment, the display 8 displays a message "SELF-TEST RUNNING" when the microcontroller is running the self-test and a message "SELF-TEST COMPLETE" when the self-test is complete. Any type of suitable message or symbol may be displayed on the display 8. This embodiment also verifies to external test equipment or a user that the display 8 is functioning properly.

In another embodiment, the microcontroller 85 outputs a report to be monitored by external test equipment on a serial input/output (I/O) port (not shown), instead of or in addition to a GPIO port.

During or after the internal self-test sequence (blocks 250–275, 295, 300), the external test equipment may perform calibration and measure external parameters (parametric values), such as logic levels or current consumption. For example, in a process block 290, the external test equipment measures the current drain of the system 60 or a particular component as a function of time. By observing the interval duration of the GPIO output pulses and then measuring the frequency of the GPIO sequence, the external test equipment may verify that the internal clock 100 (FIG. 3) within the system 60 is functioning properly.

In one embodiment, the external test equipment also verifies that a digital power supply of the microcontroller 85 and its associated circuitry are functioning properly by measuring the voltage (amplitude) of the GPIO signal. In contrast to existing test systems, the internal self-test sequence does not require additional test points to test the clock 100, the microcontroller 85, the digital power supply of the microcontroller 85 and the components 115–155.

In one embodiment, the external test equipment injects an input signal with certain parametric characteristics (e.g. a certain frequency and power) into an input port (e.g. an antenna) of the system 60. The system 60 processes the input signal and transmits an output signal via an output port (e.g. a speaker). The external test equipment then measures the transmit frequency and power level of the output signal. Based on expected parametric values, the external test equipment determines whether the system 60 is functioning properly. The external test equipment may also test whether the I/O ports work properly. In one embodiment, the whole test process is approximately 30 seconds or less in duration.

In one embodiment, the microcontroller 85 or the external test equipment performs a cyclic redundancy check (CRC) check on the internal code or firmware to ensure that it is functioning properly. In one embodiment, the external test equipment performs a test on the digital components of the system 60.

In FIG. 5, if the system 60 is in the field operation test mode, the microcontroller 85 runs a field test, as shown in a process block 255. The field test is preferably autonomous, without external test equipment to generate stimulus signals or to measure outgoing signals.

In one embodiment, the field test comprises certain executable portions of the factory test mode program, as described above with reference to FIG. 5. Specifically, the field test comprises substantially the same operations as the internal self-test sequence executed by the microcontroller 85 in the factory test mode: use the battery 95 and the microcontroller 85 to power on and off each component 115–155, measure the current drain with the current sensor 90, and report the results of the self-test.

In one embodiment, after an internal self-test in field test mode, the microcontroller 85 makes a 'go/no go' decision. In other words, if the system 60 fails the field test upon power-up, no further operation is to be performed by the system 60. For example, in the communication handset 5 of FIG. 1, the handset 5 does not allow a user to transmit if the handset 5 fails a field test. In contrast, in one embodiment of the factory test mode described above, the external test equipment may try to isolate faults and identify the defective component(s).

The results of the field test are either reported visually on the display 8 (FIG. 1) of the handset 5 or signaled by a sound emitted by the speaker (not shown) of the handset 5. If the field test uses the display 8, the microcontroller 85 (FIG. 3) transmits a signal to the display circuit 165 to display one or more waveforms, symbols or messages. The display 8 or speaker may inform the user which component(s) 115–155 is defective.

In one embodiment, the field test displays messages such as "SELF-TEST RUNNING" when the microcontroller 85 is running the self-test and a message "SELF-TEST COMPLETE" when the self-test is complete. These messages boost a user's confidence that the device is working properly. The messages also justify the few seconds of delay before a network connection is established for the user after the user powers on the handset 5 (FIG. 1).

While embodiments and applications of this invention have been shown and described, it will be apparent to those skilled in the art that various modifications are possible without departing from the scope of the invention. It is, therefore, to be understood that within the scope of the appended claims, this invention may be practiced otherwise than as specifically described.

What is claimed is:

1. In an electrical device with at least one power supply and a plurality of components, an internal test system comprising:

a microcontroller adapted to control the power on and off of each component of the plurality of components one at a time;

a current sensor adapted to measure the amount of current drawn by each component of the plurality of components as the component is powered on and off by the microcontroller, the microcontroller comparing the amount of current drawn by each component as measured by the current sensor with an expected current range for each component; and an output adapted to report whether the amount of current drawn by each component as measured by the current sensor is within the expected current range for each component.

2. The electrical device of claim 1, wherein the current sensor is within the electrical device.

3. The electrical device of claim 1, wherein the current sensor is adapted to measure the amount of current drawn at each component site as each component is powered on and off by the microcontroller.

4. The electrical device of claim 1, wherein the current sensor is adapted to measure the amount of current drawn at the power supply as each component is powered on and off by the microcontroller.

5. The electrical device of claim 1, wherein the microcontroller powers on at least one component for a set period of time before powering the component off.

6. The electrical device of claim 1, further comprising a memory adapted to store an order in which the plurality of components are tested, and a set of expected current ranges for the plurality of components.

7. The electrical device of claim 1, wherein the output is a pattern of signals on a serial input/output line.

8. The electrical device of claim 1, wherein the output is a pattern of signals on a general purpose input/output (GPIO) line.

9. The electrical device of claim 1, wherein the output is a message on a display of the electrical device.

10. The electrical device of claim 1, wherein the output is a sound generated by a speaker.

11. The electrical device of claim 1, wherein the electrical device is a portable communication handset.

12. The electrical device of claim 11, wherein the portable communication handset is a wireless phone.

13. The electrical device of claim 11, wherein the portable communication handset is a cordless phone.

14. The electrical device of claim 11, wherein the portable communication handset is a cellular phone.

15. The electrical device of claim 1, wherein the power supply is a lithium ion cell.

16. The electrical device of claim 1, wherein the plurality of components are selected from the group consisting of:
   a power amplifier;
   a low noise amplifier (LNA) mixer;
   an analog-to-digital converter;
   a digital-to-analog converter;
   an intermediate frequency (IF) amplifier;
   a speaker driver;
   a bias supply for a microphone;
   a set of discrete controls;
   a plurality of loop backs; and
   any combination of the above components.

17. The electrical device of claim 1, wherein the output provides sufficient information to an external test equipment to perform a fault isolation procedure.

18. The electrical device of claim 1, wherein the output provides sufficient information to an external test equipment to determine whether a clock inside the electrical device is functioning properly.

19. In an electrical device with at least one power supply and a plurality of component groups, an internal test system comprising:

a microcontroller adapted to control the power on and off of each component group of the plurality of component groups one at a time;

a current sensor adapted to measure the amount of current drawn by each component group of the plurality of component groups as the component group is powered on and off by the microcontroller, the microcontroller comparing the amount of current drawn by each component group as measured by the current sensor with an expected current range for each component group; and an output adapted to report whether the amount of current drawn by each component group as measured by the current sensor is within the expected current range for each component group.

20. A method of testing a plurality of components in an electrical device with at least one power supply and one microcontroller, said method comprising:

powering on and off each component of the plurality of components one at a time;

measuring the amount of current drawn by each component as the component is powered on and off;

comparing the amount of current drawn by each component with an expected current range for each component; and reporting whether the amount of current drawn by each component is within the expected current range for each component.

21. The method of claim 20, wherein one or more components closest logically to the microcontroller are tested first, and one or more components farthest logically to the microcontroller are tested last.

22. The method of claim 20, wherein more reliable components are tested before less reliable components.

23. The method of claim 20, further comprising:
   receiving an external signal to begin powering on and off each component of the plurality of components one at a time.

24. The method of claim 20, further comprising:
   performing fault isolation to determine which components are defective based on the amount of current drawn by each component compared to the expected current range for each component.

25. The method of claim 20, wherein the act of reporting whether the amount of current drawn by each component is within the expected current range for each component comprises generating a pattern of signals on a general purpose input/output (GPIO) line.

26. The method of claim 20, wherein the act of reporting whether the amount of current drawn by each component is within the expected current range for each component comprises generating a message on a display of the electrical device.

27. The method of claim 20, wherein the act of reporting whether the amount of current drawn by each component is within the expected current range for each component comprises generating a sound from a speaker.

* * * * *